United States Patent [19]

Hongo et al.

[11] Patent Number: 4,814,741

[45] Date of Patent: Mar. 21, 1989

[54] DIGITAL REMOTE CONTROL DEVICE

[75] Inventors: Katsunobu Hongo; Shinji Suda; Hiroshi Kobayashi; Daisuke Shichinohe, all of Hyogo, Japan

[73] Assignee: Mitsubishi Denki K.K., Tokyo, Japan

[21] Appl. No.: 43,608

[22] Filed: Apr. 28, 1987

[30] Foreign Application Priority Data

Apr. 30, 1986 [JP] Japan ................................ 61-100087
Apr. 30, 1986 [JP] Japan ................................ 61-100089
May 1, 1986 [JP] Japan ................................ 61-102447

[51] Int. Cl.$^4$ ........................ H04Q 7/00; H03K 17/94

[52] U.S. Cl. ........................ 340/825.650; 340/825.720; 341/29

[58] Field of Search ........................ 340/825.65, 825.72, 340/365.5; 455/603; 375/117

[56] References Cited

U.S. PATENT DOCUMENTS 4,210,777 7/1980 Bowerman et al. ................ 375/117
4,242,664 12/1980 Lindstedt ......................... 340/168 S
4,609,908 9/1986 Amano ........................... 340/365 S

FOREIGN PATENT DOCUMENTS 85105037-7 4/1985 European Pat. Off. .

OTHER PUBLICATIONS

Guido Torelli et al., "PCM Remote Control Chips Detect Transmission Error", *Electronic Engineering,* vol. 55 (1983), Apr., No. 676, pp. 41-47.

*Primary Examiner*—Donald J. Yusko
*Attorney, Agent, or Firm*—Yusuke Takeuchi

[57] ABSTRACT

A digital remote control device for use in a transmitter capable of transmitting an end code following each transmission code, which includes a counting circuit for counting the number of transmission operations performed by pressing a key or keys on the transmitter; and an end pulse changing circuit for changing a configuration of the end code such that the configuration corresponds to a count value counted by the counting circuit.

4 Claims, 12 Drawing Sheets

DIGITAL REMOTE CONTROL DEVICE

BACKGROUND OF THE INVENTION

The present invention relates to digital remote control devices and, more particularly, to a digital remote control device for performing transmission in a signal format which has an end pulse or pulses indicating an end of the transmission.

A conventional remote control system is shown in FIG. 6. The remote control system includes a transmission circuit 1 for transmitting a transmission code modulated at a certain frequency, a receiving circuit 2 for processing the received signal, a light emission section 3 which consists of a light emitting element, such as a light emitting diode, and receives an output of the transmission circuit 1, and a light receiving section 4 which consists of a light receiving element, such as a photodiode, and receives a light signal (a) from the light emitting section 3 and sends an output to the receiving circuit 2.

The waveforms of pulses representing a 0 and a 1 are shown in FIGS. 7(*a*) and (*b*), respectively; i.e., pulse intervals 5 and 6 represent a 0 and a 1 respectively.

The waveform of a conventional transmission code format is shown in FIG. 8. The conventional transmission code 7 consists of a custom code 8 and an instruction code 9 and repeats itself with a repetition period 12.

In operation, the transmission circuit 1 encodes and modulates the information to be transmitted. The light emitting section 3 then transforms it into an optical signal (a) for transmission. The light receiving section 4 then receives the optical signal, and the receiving circuit 2 demodulates and decodes it into an instruction.

The remote control system makes distinction between a bit 0 and a bit 1 by the length of an interval between pulses as shown in FIG. 7, wherein the shorter pulse interval 5 and the longer pulse interval 6 represent a 0 and a 1 respectively.

In the transmission code format of FIG. 8, several bits of 0s and 1s are combined to form a transmission code or word 7 such that the type of an instruction is distinguished according to the data code of the word 7. In order to avoid interference with other remote control systems, a few bits of the transmission code 7 are allocated to the custom code 8 and the remaining bits are allocated to the instruction code 9. For example, if three bits of a 10-bit transmission code are allocated to the custom code 8 and seven bits are allocated to the instruction code 9, eight ($=2^3$) different systems each having 128 ($=2^7$) instructions may be made.

When the transmitter has transmitted a transmission code 7 such as shown in FIG. 8, the receiver first decodes the custom code 8 of the transmission code 7 and then decodes the instruction code 9. If the decoded custom code agrees with the code given to the receiver, the receiver executes the instruction.

The uses of a digital remote control system such as shown in FIG. 6 include selecting the channel, adjusting the volume and turning on or off the power switch of a TV receiver, quick feeding and rewinding a tape and setting a start or stop time of a VTR or VCR, and selecting a cooling, warming or dehumidifying function, setting the desired time and temperature and remote turning on or off the switch of an air conditioner. In addition, the digital remote control system may be used in fields of industrial robots and medical equipment.

FIG. 9 shows a use of the digital remote control device for controlling a TV receiver. The transmission circuit 1 and the light emitting section 3 are incorporated into a transmitter 20, while the receiving circuit 2 and the light receiving section 4 are incorporated into the TV receiver 22. 12 channel setting keys $21_1$ through $21_{12}$ are mounted on the transmitter 20 for operating the transmission circuit 1. The TV receiver further includes a control section 23 for processing a signal from the receiving circuit 2 to control circuitry of the TV receiver 22 and a channel display section 24 for display a channel selected.

As shown in FIG. 10, when a key $21_1$ of the keypad 21 is depressed for a period of time Tm, a series of words $7_1$ through $7_7$ each containing key data "1" is output continuously for the period of time Tm. The words $7_1$–$7_7$ are received by the control section 23 via the light emitting section 3 and the light receiving section 4. In response to the input data, the control section 23 displays a number 1 at the channel display section 24 as shown in FIG. 9 and changes the picture selection mode to a No. 1 channel mode to display a picture of channel 1 on the CRT.

A period of time Tw after the key $21_1$ is released, a key $21_3$ is pressed for a period of time Tn to send a series of words $7_8$ through $7_{15}$ each containing key data "3" to the control section 23. Based on the input key data "1" and "3", the control section 23 displays a number 13 at the channel display section 24 while changing the picture selection mode to a No. 13 channel mode.

In the conventional digital remote system, however, if the same transmission code is received more than twice continuously by the receiver because of temporary interruption of the optical signal (a) resulting from the passage of an obstacle through the transmission path or the same transmission code is sent by successively pressing the same key, it is impossible to decide whether the same key is pressed twice or the same key is pressed continuously but the optical signal is interrupted temporarily. This causes the equipment to malfunction.

More specifically, in FIG. 10, if an optical signal is interrupted for a period of time Ts for some reason, the words $7_1$–$7_3$ and $7_6$–$7_7$ are received by the control section 24, wherein decision is made that the key $21_1$ has been pressed twice for the time periods To and Tr. Consequently, a number 11 is displayed at the channel display section 24 despite the fact that channel 1 has been selected. Such a malfunction may be corrected by pressing other keys, but the key operation becomes complicated. In addition, a malfunction like this is not allowable in the case of controlling a piece of medical equipment.

SUMMARY OF THE INVENTION

Accordingly, it is an object of the present invention is to provide a digital remote control device capable of deciding whether the same key is pressed continuously or repeatedly when the same instruction code is received.

According to the invention there is provided a digital remote control device which includes a counting circuit for counting the number of transmission operations performed by pressing input keys on a transmitter and an end pulse changing circuit for changing the configuration of an end code such that the configuration corresponds to the numeric value counted by the counting circuit.

BRIEF DESCRIPTION OF THE DRAWINGS

FIG. 1(*b*) is a detailed block diagram of a transmission circuit in the digital remote control device of FIG. 1;

FIG. 4(*b*) is a waveform diagram showing the waveform of each end pulse used in the device of FIG. 4(*a*);

FIG. 5(*b*) is a waveform diagram showing the waveform of end pulses in the device of FIG. 5(*a*);

DESCRIPTION OF THE PREFERRED EMBODIMENT

Figure 1A:
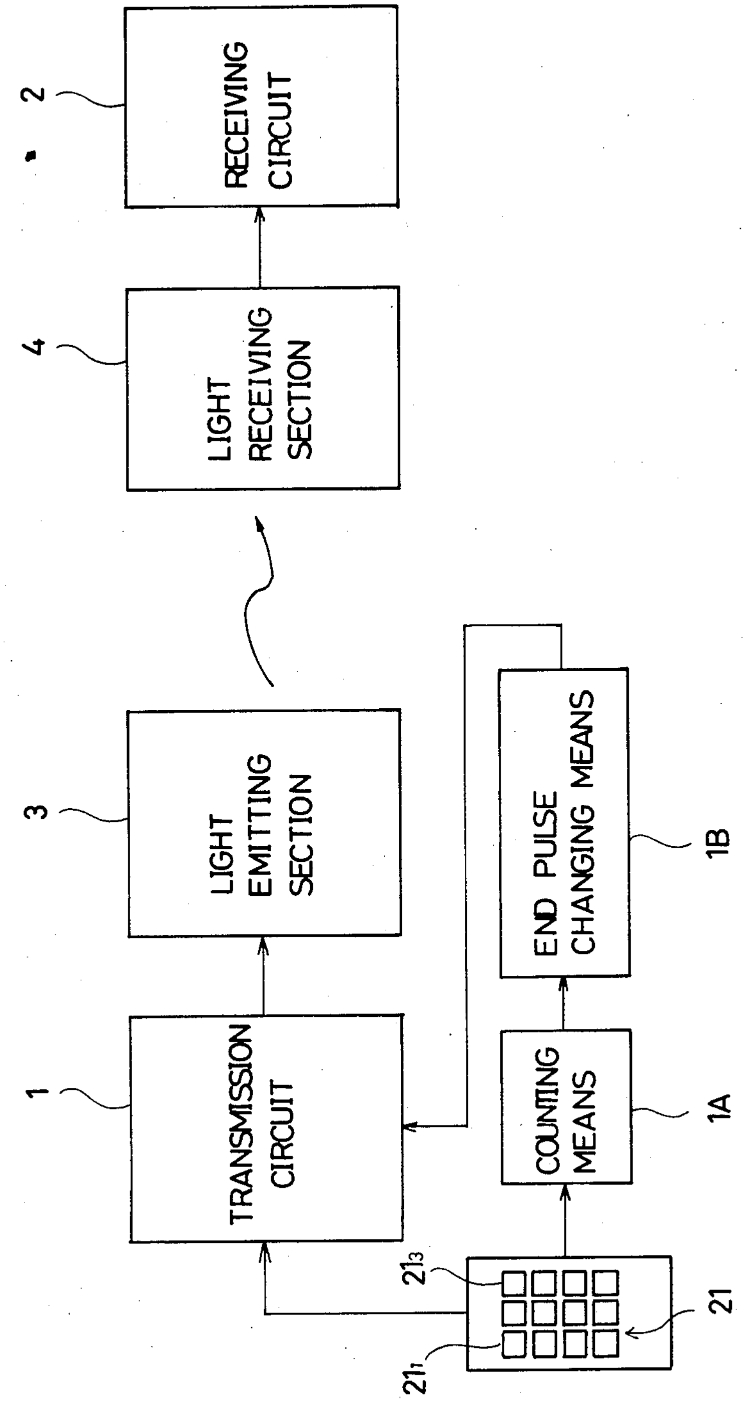
FIG. 1(*a*) is a block diagram of a digital remote control device according to an embodiment of the present invention.
Figure 1:
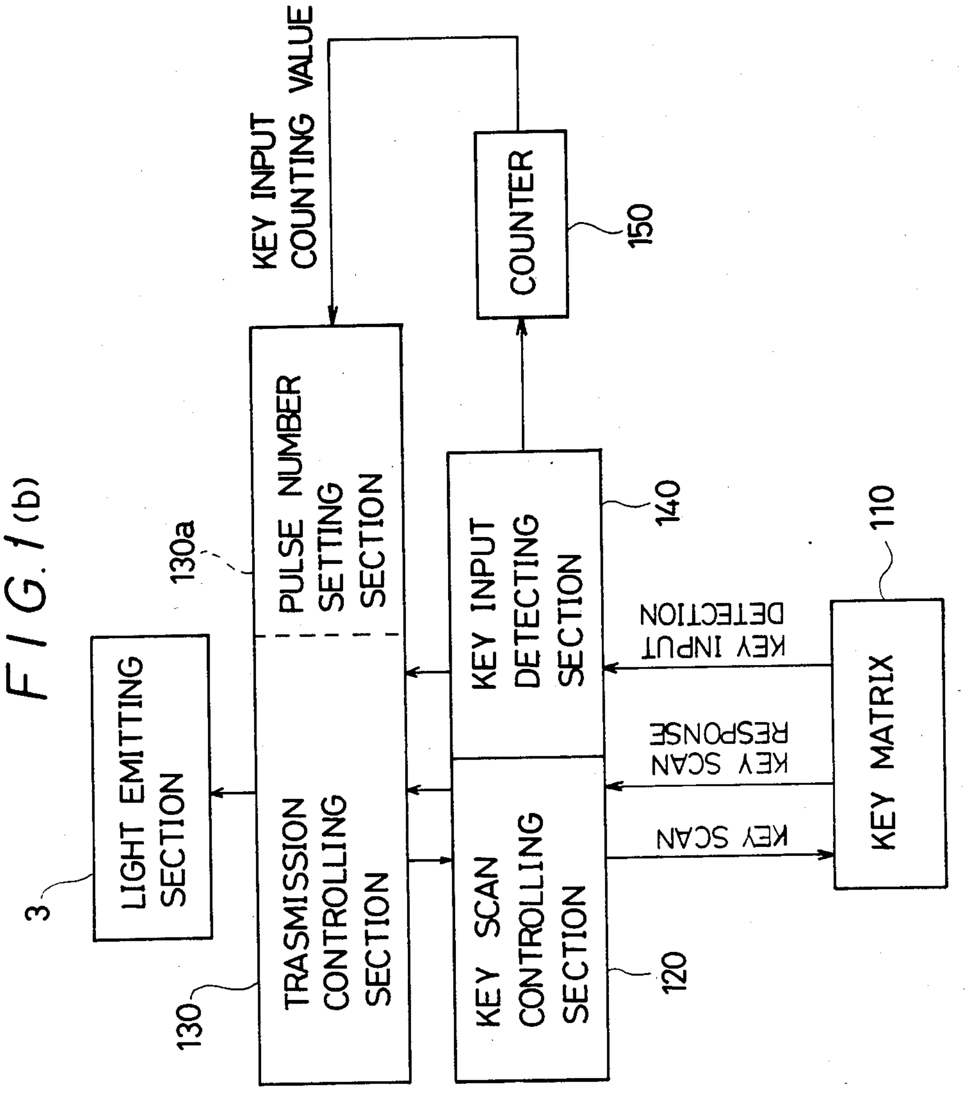

In FIG. 1(*a*), a digital remote control device includes a counting circuit 1A which consists of one-bit or multibit counter and counts the number of transmission operations performed by pressing input keys, and an end pulse changing circuit 1B for changing a configuration of an end code such that the configuration corresponds to the numeric value counted by the counting circuit 1A. In this embodiment, the end pulse changing circuit 1B is made in the form of a pulse number setting circuit which changes the number of pulses constituting the end code.

Figure 2:
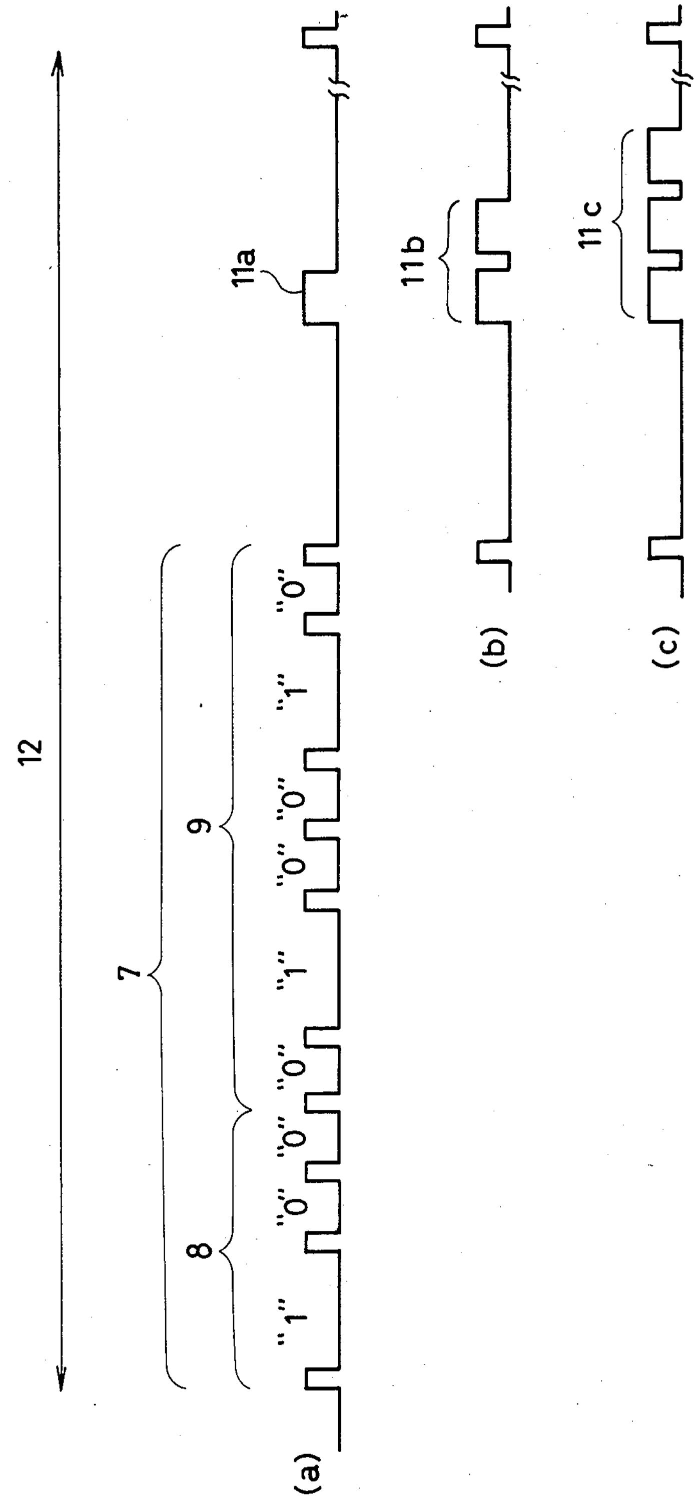
FIG. 2 is a waveform diagram showing different configurations of transmission data used in the device of FIG. 1.

In FIG. 2, a transmission code 7 consists of a custom code 8, an instruction code 9, and an end code 11*a*, 11*b* or 11*c* each having information about the number of transmission operations. Reference numeral 12 is a repetition period of the transmission code.

In FIG. 1(*b*), the transmission circuit 1 includes a key matrix 110 for receiving a key input corresponding to the depressed key 21, a key scan controlling section 120 for scanning the keys to provide a signal corresponding to the key input, a transmission controlling section 130 which receives the signal from the key scan controlling section 120 and sends a transmission code to the light emitting section 3, a key input detecting section 140 for detecting a key input detecting signal output from the key matrix 110 every time a key is pressed, and a counter 150, which corresponds to the counting circuit 1A of FIG. 1(*a*), for counting an output from the key input detecting section 140.

A pulse number setting section 130*a*, which corresponds to the end pulse changing circuit, receives a count value from the counter 150 to set the number of end pulses and insert the end pulses into the transmission code. The pulse number setting circuit for changing the number of pulses according to an input is well known and, therefore, its detailed description is omitted.

In operation, the one-bit or multibit counter 150 counts the number of times a key is pressed for forming an end code, whereof the number of pulses corresponds to the count value. These end pulses are transmitted following the custom code 8 and the instruction code 9.

For example, every time a key on the transmitter is pressed, the counter 150 increases the count value by one so that the count value changes cyclically as 1→2→3→1→2→ . . . , and the end pulses are transmitted as 11*a*→11*b*→11*c*→11*a*→11*b*→ . . . as shown in FIG. 2.

The receiver receives and decodes the custom code 8, the instruction code 9, and one of the end code 11*a*, 11*b* and 11*c* depending on the count value. If the custom code 8 agrees with the custom code allocated to the receiver and the waveform (number of pulses) of the end code is different from that of the end code received before, it is decided that the same key has been pressed twice so that the receiver execute the instruction. If the waveform of the end code is the same as that of the end code received before, it is decided that the key is not pressed twice so that the receiver does not execute the instruction.

Figure 3:
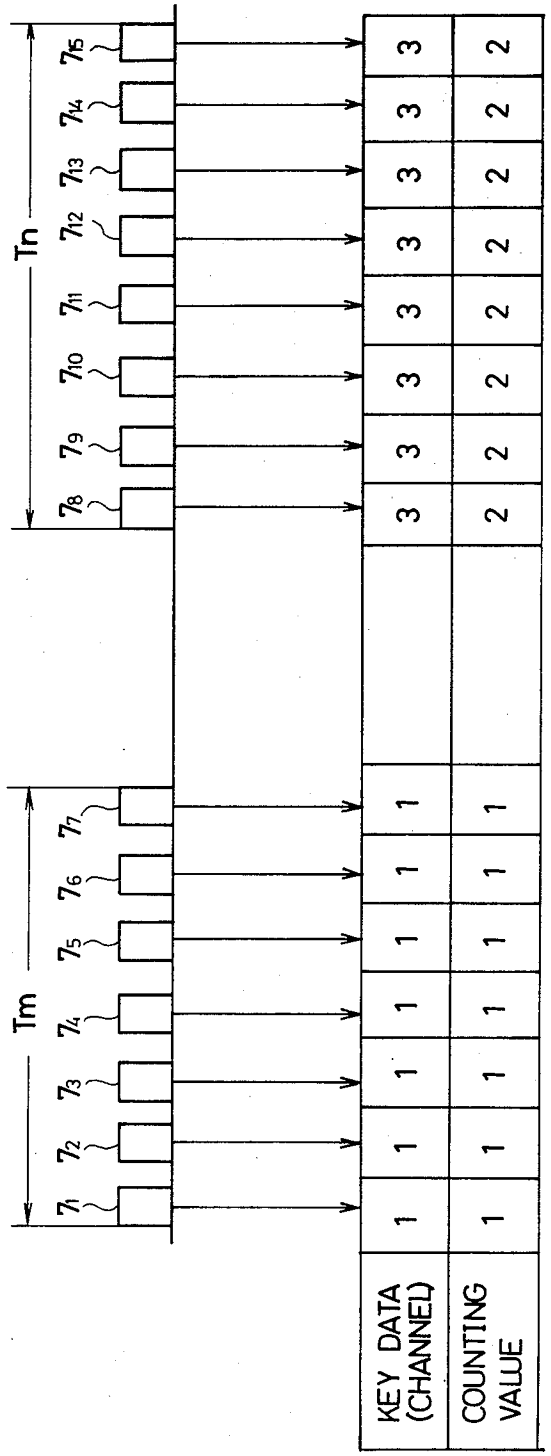
FIG. 3 is a waveform diagram useful for explaining the operation of the device of FIG. 1.

In FIG. 3, when two keys $21_1$ and $21_3$ are pressed in sequence for periods of time Tm and Tn, respectively, a series of words $7_1$–$7_7$ each representing the selected key No. 1 and a series of words $7_8$–$7_{15}$ each representing the selected key No. 3 are transmitted in the same manner as in the conventional system except that numeric values of 1 and 2 are added to the words $7_1$–$7_7$ and $7_8$–$7_{15}$, respectively. In this way, every time a key is pressed, a new numeric value stepped up by one is added to the words.

In consequence, even if words $7_4$–$7_5$, for example, are omitted, the numeric values added to the words $7_6$–$7_7$ are the same as those of the words $7_1$–$7_3$ so that it is decided that the words $7_4$–$7_5$ are the same words, and the control section 23 does not repeat execution of the same instruction.

Figure 4:
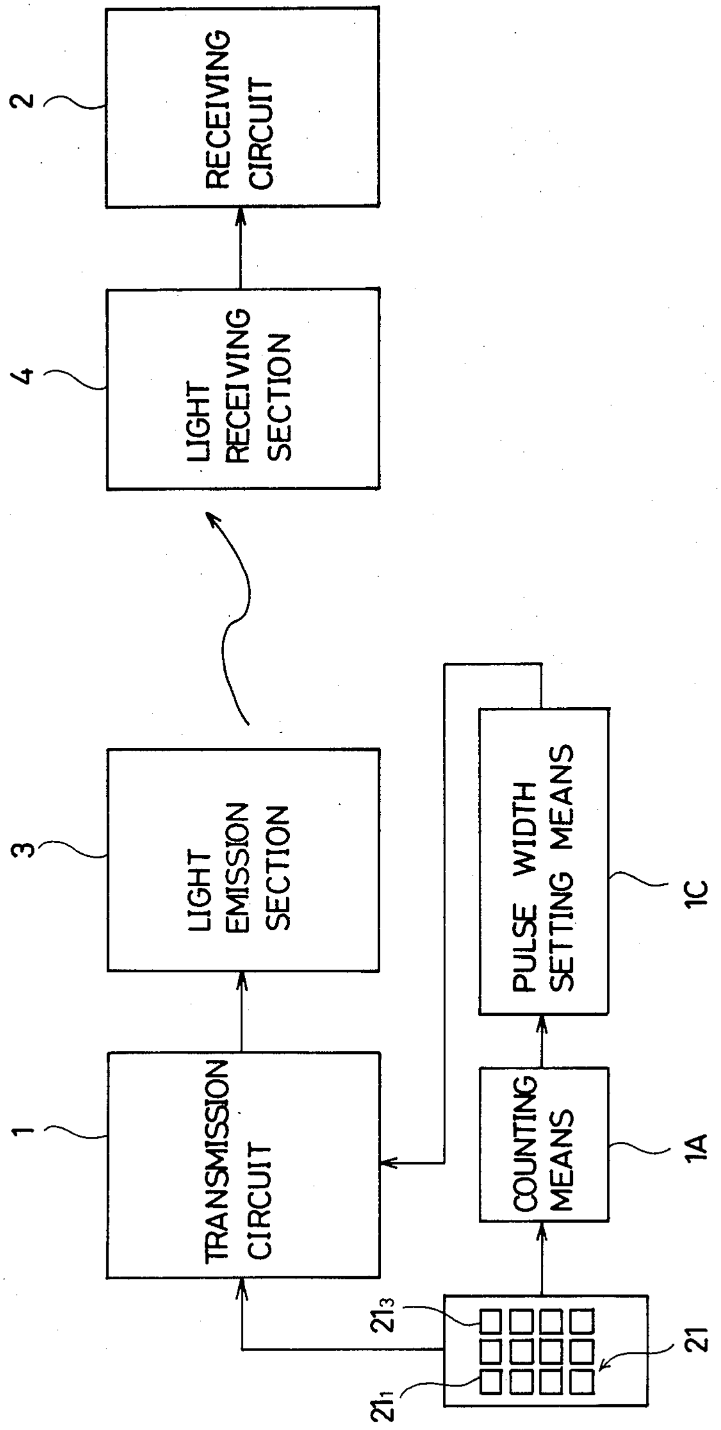
FIG. 4(*a*) is a block diagram of a digital remote control device according to another embodiment of the invention.
Figure 4B:
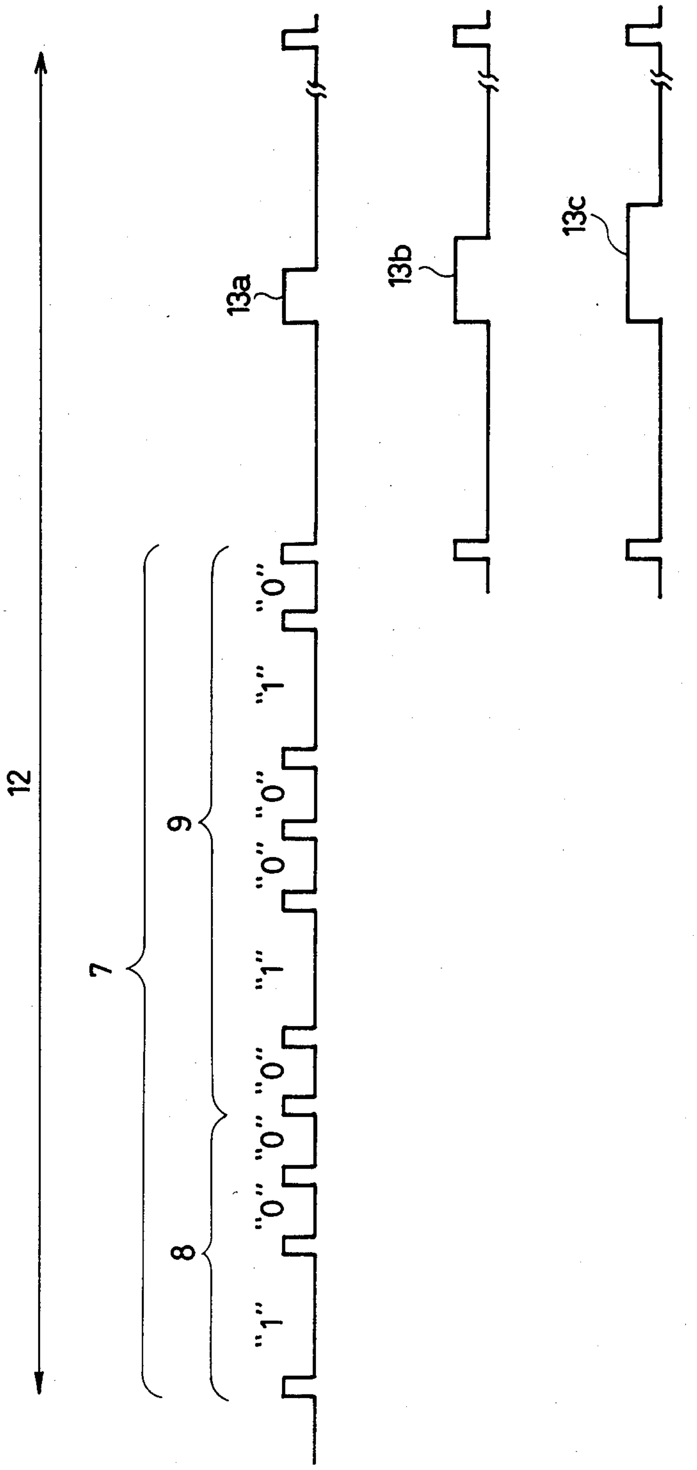

FIG. 4(*a*) shows a digital remote control device according to another embodiment of the invention, which includes a pulse width setting circuit 1C capable of providing end codes or pulses of different widths 13*a*, 13*b*, and 13*c* in accordance with the count value from the counting circuit 1A as shown in FIG. 4(*b*). That is to say, the pulse width setting circuit 1C outputs an end pulse 13*a* of the smallest width for a count value of 1, an end pulse 13*b* of the medium width for a count value of 2, and an end pulse 13*c* of the largest width for a count value of 3. This permits the receiver to know the count value contained in the end code sent from the transmitter.

The circuit for generating pulses of different widths is well known and, therefore, its detailed description is omitted.

In this second embodiment, the transmission circuit 1 is the same as that of the first embodiment in FIG. 1(*b*) except that the pulse number setting section 130*a* is replaced by the pulse width setting section 1C. The pulse width setting section 1C receives a count value from the counting circuit 1A to set the pulse width of an end pulse and inserts the end pulse of the set width into the transmission code. By using the difference in width among pulses, it is possible to make the end code correspond to a numeric value, thereby providing the same results as those of the first embodiment.

Figure 5A:
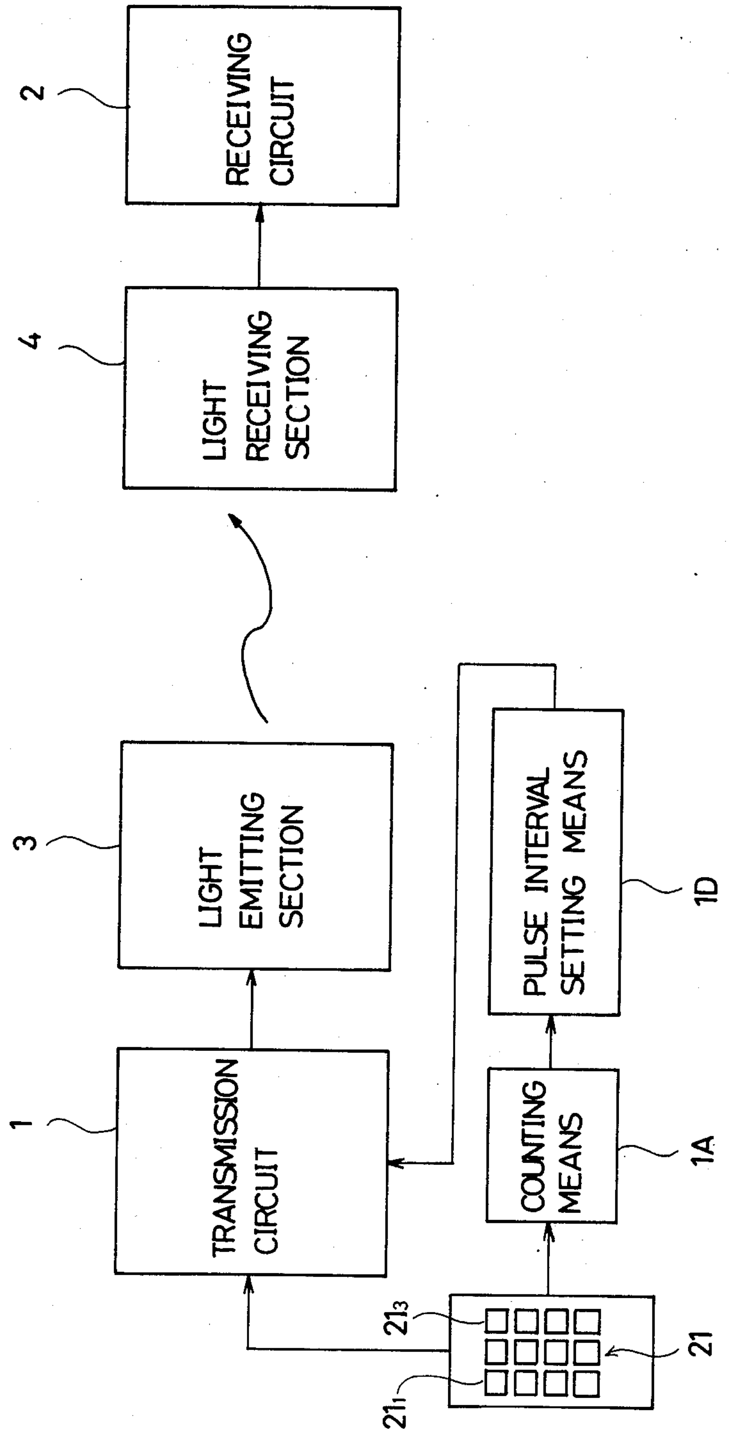
FIG. 5(*a*) is a block diagram of a digital remote control device according to still another embodiment of the invention.
Figure 5B:
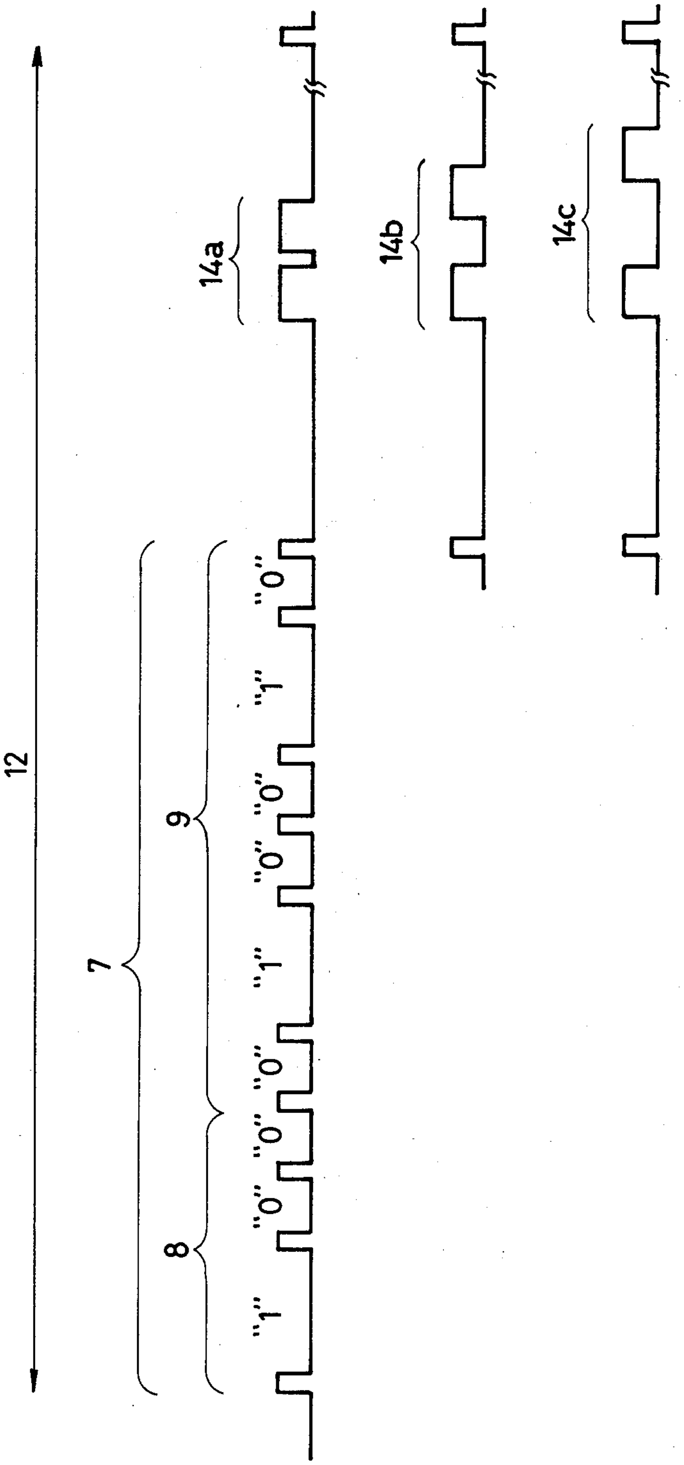
Figure 6:
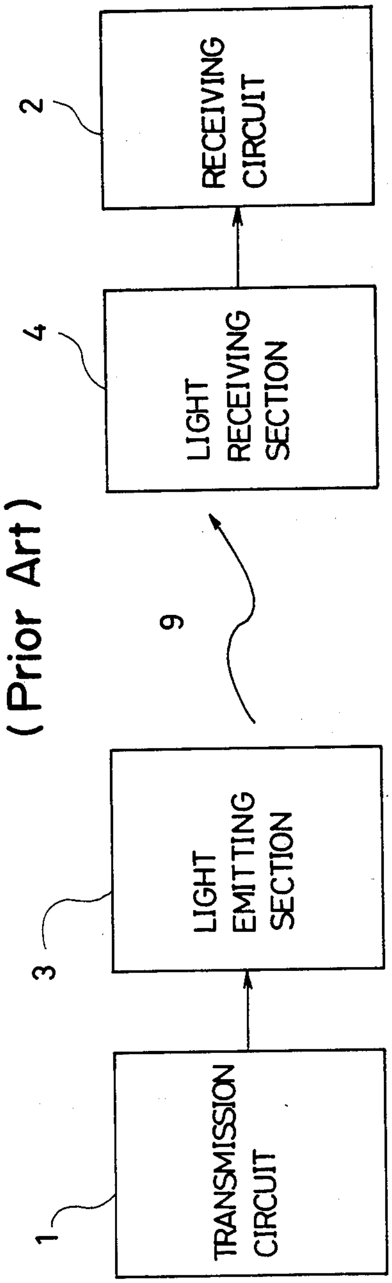
FIG. 6 (Prior Art)
FIG. 6 is a block diagram of a conventional remote control system.
Figure 7:
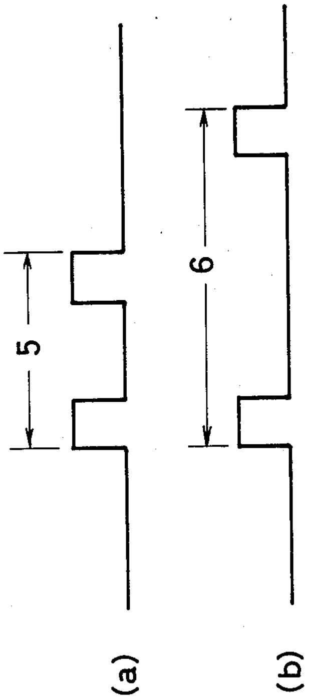
FIG. 7 (Prior Art)
FIG. 7 is a waveform diagram showing two different pulse intervals (a) and (b) representing a 0 and a 1 respectively.
Figure 8:
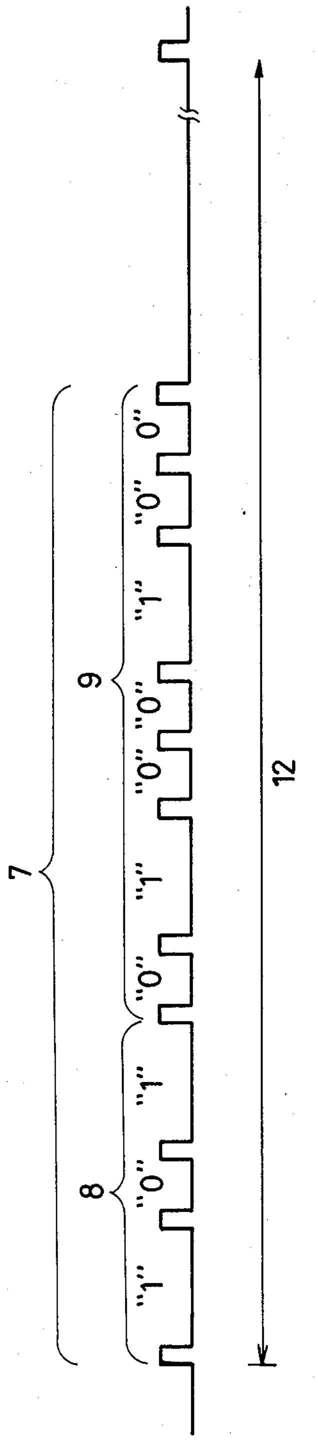
FIG. 8 (Prior Art)
FIG. 8 is a waveform diagram showing a conventional transmission code format.
Figure 9:
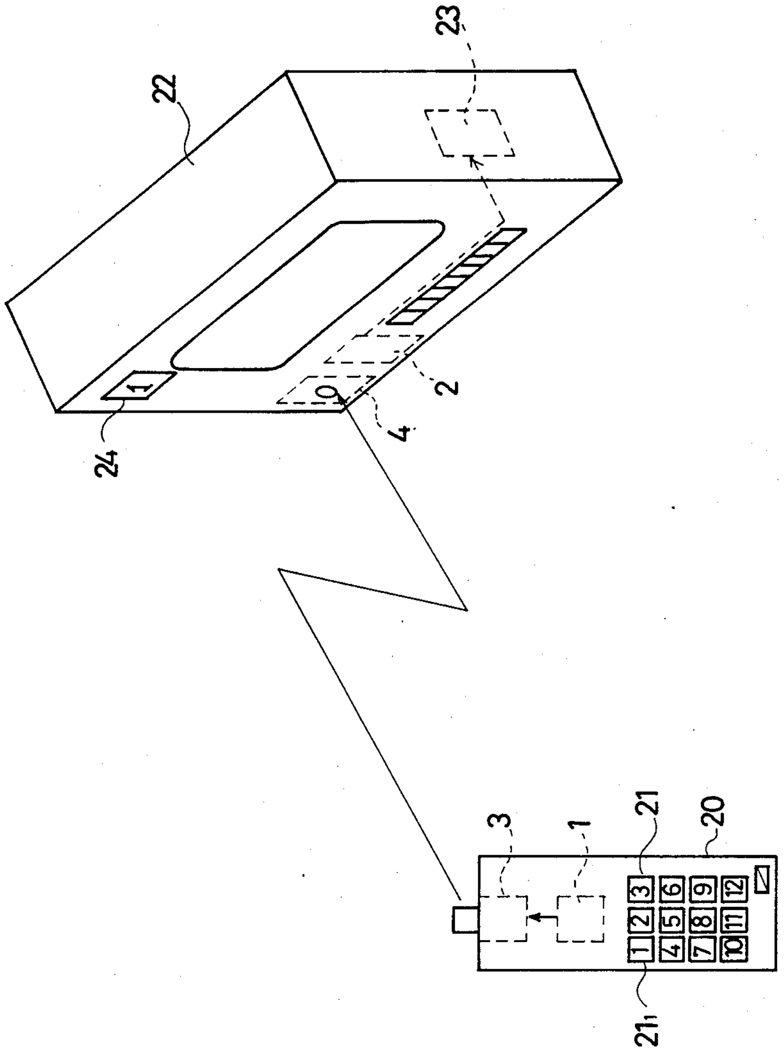
FIG. 9 shows a use of the conventional remote control system for controlling a TV receiver.
Figure 10:
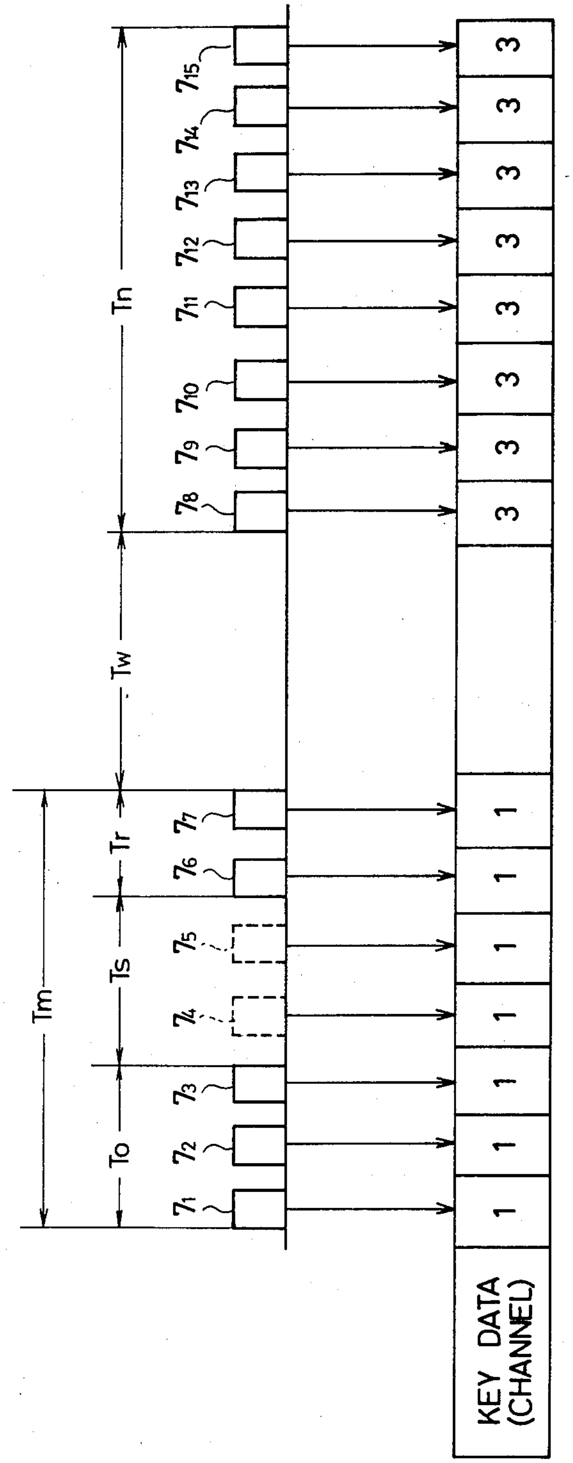
FIG.10 (Prior Art)
FIG. 10 is a waveform diagram useful for explaining a problem with the conventional remote control system.

FIG. 5(*a*) shows a digital remote control device according to still another embodiment of the invention, which includes a pulse interval setting circuit 1D capable of providing end code or pulses of different intervals 14*a*, 14*b*, and 14*c* in accordance with the count value from the counting circuit 1A as shown in FIG. 5(*b*). More specifically, the pulse interval setting circuit 1D outputs a pair of end pulses 14*a* of the smallest interval for a count value of 1, a pair of end pulses 14*b* of medium interval for a count value of 2, and a pair of pulses 14*c* of the largest interval for a count value of 3, whereby the receiver is able to know the count value contained in the end code sent from the transmitter.

The circuit for generating pulses of different intervals is well known and, therefore, its detailed description is omitted.

In this third embodiment, the transmission circuit 1 is the same as that of FIG. 1(*b*) except that the pulse number setting section 130*a* is replaced by the pulse interval setting circuit 1D. The pulse interval setting section 1D receives a count value from the counting circuit 1A to set the pulse interval of end pulses and insert the end pulses of the set interval into a transmission code. By using the difference in intervals between the end pulses it is possible to make the end pulses correspond to a numeric value, thereby providing the same results as those of the first embodiment.

In the above embodiments, the number of transmission operations is counted up to three by providing three different waveforms of an end code for each transmission mode, but it may be set to any number as long as the pulse waveforms are different from each other. The end code is spaced far from the instruction code, but it may be arranged immediately following the instruction code. The instruction is not executed if the waveform (number of pulses) of an end code is the same as that of the end code received before, but this condition may be altered so that the instruction is not executed if the waveforms of both the instruction code and the end code are the same as those of the instruction code and the code received before.

As has been described above, the digital remote control device according to the invention adds to the transmission code an end code, whereof the pulse waveform is altered according to the number of transmission operations such as times of pressing a key or keys. Consequently, the receiver is able to read the number of transmission operations and decide whether the same key is pressed continuously or twice in sequence when the same instruction code has been received.

What is claimed is:

1. A digital remote control device for a transmitter capable of transmitting an end code following transmission data, wherein the improvement comprises:

counting means for counting the number of transmission operations performed by pressing an input key or keys on said transmitter, and end pulse changing means for changing a configuration of said end code such that said configuration corresponds to a count value counted by said counting means.

2. The digital remote control device according to claim 1, wherein said end pulse changing means is a pulse number setting circuit capable of changing the number of pulses which constitute said end code.

3. The digital remote control device according to claim 1, wherein said end pulse changing means is a pulse width setting circuit capable of changing the width of a pulse which constitutes said end code.

4. The digital remote control device according to claim 1, wherein said end pulse changing means is a pulse interval setting circuit capable of changing the pulse interval between a pair of pulses which constitute said end code.

* * * * *